US012674230B2

(12) United States Patent
Lee

(10) Patent No.: US 12,674,230 B2
(45) Date of Patent: Jul. 7, 2026

(54) MASK AND DEPOSITION APPARATUS INCLUDING THE SAME

(71) Applicant: Samsung Display Co., LTD., Yongin-si (KR)

(72) Inventor: Duck Jung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 414 days.

(21) Appl. No.: 18/514,911

(22) Filed: Nov. 20, 2023

(65) Prior Publication Data

US 2024/0318297 A1 Sep. 26, 2024

(30) Foreign Application Priority Data

Mar. 22, 2023 (KR) ........................ 10-2023-0037158

(51) Int. Cl.
| | |
|---|---|
| *C23C 16/04* | (2006.01) |
| *C23C 14/04* | (2006.01) |
| *H10K 59/12* | (2023.01) |
| *H10K 71/16* | (2023.01) |

(52) U.S. Cl.
CPC ............ *C23C 14/042* (2013.01); *H10K 59/12* (2023.02); *H10K 71/166* (2023.02)

(58) Field of Classification Search
CPC ..... H10F 71/00; C23C 14/50; C23C 16/4582; C23C 14/042; C23C 14/12; C23C 14/24; H01L 21/673; H01L 21/68771; H01L 21/68785; H10K 59/12; H10K 71/166; H10K 50/10

USPC .......... 269/1; 279/1; 361/234, 233; 118/728, 118/500; 156/345.51; 414/941
See application file for complete search history.

(56) References Cited

U.S. PATENT DOCUMENTS

| | | | |
|---|---|---|---|
| 10,522,794 B2 | 12/2019 | Khayrullin et al. | |
| 10,644,239 B2 | 5/2020 | Ghosh et al. | |
| 11,035,033 B2 | 6/2021 | Donoghue et al. | |
| 11,121,321 B2 | 9/2021 | Donoghue et al. | |
| 2014/0353598 A1* | 12/2014 | Jeong .................... | H10W 46/00 257/40 |
| 2016/0236220 A1* | 8/2016 | Kim ......................... | B05B 12/20 |
| 2018/0071764 A1* | 3/2018 | Gong .................... | C23C 14/042 |

(Continued)

FOREIGN PATENT DOCUMENTS

| | | |
|---|---|---|
| CN | 111304626 A | 6/2020 |
| KR | 1020050013934 | 2/2005 |

(Continued)

*Primary Examiner* — Rudy Zervigon
(74) *Attorney, Agent, or Firm* — CANTOR COLBURN LLP

(57) ABSTRACT

A mask for a deposition process of an emission layer includes a mask body including first mask grids extending along a first direction and second mask grids extending along a second direction perpendicular to the first direction, a plurality of holes defined by the first mask grids and the second mask grids, where the plurality of holes is defined through a portion of the mask body, first heater wires disposed to overlap the first mask grids and connected to first wires, second heater wires disposed to overlap the second mask grids and connected to second wires, first pads connected to the first wires, and second pads connected to the second wires, where a current or a voltage is inputted to the first pads and the second pads through a probe.

20 Claims, 14 Drawing Sheets

HL21 HL22 HL23
PD21 PD22 PD23

PD11
HL11
HL12
PD12
HW2
PD13
HL13
OP1
HL14
PD14

MP
UM
OP2
OP
MG1

HW1 MG2

UM
OP

HW : HW1, HW2
MG : MG1, MG2
HL1 : HL11, HL12, HL13, HL14
HL2 : HL21, HL22, HL23
PD1 : PD11, PD12, PD13, DP14
PD2 : PD21, PD22, PD23
HD : HW, HL1, HL2
PD : PD1, PD2

DR2
DR3 → DR1

(56)        References Cited

U.S. PATENT DOCUMENTS

| | | | | |
|---|---|---|---|---|
| 2019/0305222 A1* | 10/2019 | Jung | ..................... | C23C 14/042 |
| 2020/0058906 A1* | 2/2020 | Kim | ..................... | C23C 14/042 |
| 2020/0251656 A1* | 8/2020 | Kim | ..................... | C23C 16/042 |
| 2021/0108303 A1* | 4/2021 | Ahn | ........................ | C23C 14/34 |
| 2022/0384769 A1* | 12/2022 | Baek | ..................... | C23C 14/042 |
| 2024/0075496 A1* | 3/2024 | Lee | ........................ | C23C 16/042 |
| 2024/0109092 A1* | 4/2024 | Lee | ......................... | B05B 12/24 |
| 2024/0263293 A1* | 8/2024 | Kim | ................... | H10K 59/1201 |
| 2025/0255167 A1* | 8/2025 | Kang | ................... | H10K 71/166 |

FOREIGN PATENT DOCUMENTS

| | | |
|---|---|---|
| KR | 1020110065854 | 6/2011 |
| KR | 1020180052444 | 5/2018 |

* cited by examiner

MASK AND DEPOSITION APPARATUS INCLUDING THE SAME

This application claims priority to Korean Patent Application No. 10-2023-0037158, filed on Mar. 22, 2023, and all the benefits accruing therefrom under 35 U.S.C. § 119, the content of which in its entirety is herein incorporated by reference.

BACKGROUND

1. Field

The disclosure relates to a mask and a deposition apparatus including the mask.

2. Description of the Related Art

A wearable device, which is in the form of glasses or a helmet and forms a focus at a location close to the user's eyes, is being developed. For example, a wearable device may be a head mounted display (HMD) device or an augmented reality (AR) glass. Such a wearable device provides a user with an AR image or a virtual reality (VR) image.

A wearable device such as an HMD device and AR glasses may be desired to have display specifications of at least 2,000 pixels per inch (PPI) to allow users to use the wearable device for a long time without dizziness. To this end, organic light-emitting diode on silicon (OLEDoS) technology may be used to form high-resolution small organic light-emitting element display device. The OLEDoS is a technology for disposing organic light-emitting diodes (OLEDs) on a semiconductor wafer substrate on which a complementary metal oxide semiconductor (CMOS) is disposed.

SUMMARY

Embodiments of the disclosure provide a mask used in manufacturing an organic light-emitting diode on silicon (OLEDoS) display panel and provide a mask capable of improving a pixel position accuracy (PPA) to improve the reliability and reduce the cost, and a deposition apparatus including the mask.

According to an embodiment of the disclosure, a mask for a deposition process of an emission layer includes a mask body including a plurality of first mask grids extending along a first direction and a plurality of second mask grids extending along a second direction perpendicular to the first direction, a plurality of holes defined by the plurality of first mask grids and the plurality of second mask grids, where the plurality of holes is defined through a portion of the mask body, a plurality of first heater wires disposed to overlap the plurality of first mask grids and connected to a plurality of first wires, a plurality of second heater wires disposed to overlap the plurality of second mask grids and connected to a plurality of second wires, a plurality of first pads connected to the plurality of first wires, and a plurality of second pads connected to the plurality of second wires, where a current or a voltage is inputted to the plurality of first pads and the plurality of second pads through a probe.

In an embodiment, the plurality of first wires and the plurality of first heater wires may be disposed to overlap each other, respectively, and the plurality of second wires and the plurality of second heater wires may be disposed to overlap each other, respectively.

In an embodiment, the probe may be set to independently apply the current or the voltage to the plurality of first pads, and the probe may be set to independently apply the current or the voltage to the plurality of second pads.

In an embodiment, the plurality of first heater wires may be disconnected from each other, and the plurality of second heater wires may be disconnected from each other.

In an embodiment, The plurality of first heater wires may be disconnected from each other at a boundary of the plurality of holes, and the plurality of second heater wires may be disconnected from each other at the boundary of the plurality of holes.

In an embodiment, a part of the plurality of first heater wires may thermally expand a part of the plurality of first grids by being heated based on the current or the voltage, and a part of the plurality of second heater wires may thermally expand a part of the plurality of second grids by being heated based on the current or the voltage.

In an embodiment, the mask may thermally expand the part of the plurality of first grids, and thermally expand the part of the plurality of second grids during the deposition process of the emission layer.

In an embodiment, the emission layer may be a partial layer of an organic light-emitting diode (OLED) disposed on a semiconductor wafer substrate.

In an embodiment, the mask may be disposed inside a deposition chamber of a deposition apparatus, and the plurality of first heater wires and the plurality of second heater wires may be disposed to face a deposition source disposed inside the deposition chamber.

In an embodiment, the mask may be disposed inside a deposition chamber of a deposition apparatus to be fixed by a magnetic substrate, and the plurality of first heater wires and the plurality of second heater wires may be disposed between the magnetic substrate and the mask.

According to an embodiment of the disclosure, a deposition apparatus for a deposition process of an emission layer includes a deposition chamber, a mask disposed inside the deposition chamber, a deposition source disposed inside the deposition chamber, and a fixing member disposed inside the deposition chamber, where the fixing member includes a body portion and a magnetic substrate which fixes the mask thereto. In such an embodiment, the mask includes a mask body including a plurality of first mask grids extending along the first direction and a plurality of second mask grids extending along the second direction perpendicular to the first direction, a plurality of holes defined by the plurality of first mask grids and the plurality of second mask grids, where the plurality of holes is defined through a part of the mask body, a plurality of first heater wires disposed to overlap the plurality of first mask grids and connected to the plurality of first wires, a plurality of second heater wires disposed to overlap the plurality of second mask grids and connected to the plurality of second wires, a plurality of first pads connected to the plurality of first wires, and a plurality of second pads connected to the plurality of second wires, where a current or a voltage is inputted to the plurality of first pads and the plurality of second pads through a probe.

In an embodiment, the plurality of first wires and the plurality of first heater wires may be disposed to overlap each other, respectively, and the plurality of second wires and the plurality of second heater wires may be disposed to overlap each other, respectively.

In an embodiment, the probe may be set to independently apply the current or the voltage to the plurality of first pads, and the probe may be set to independently apply the current or the voltage to the plurality of second pads.

In an embodiment, the plurality of first heater wires may be disconnected from each other, and the plurality of second heater wires may be disconnected from each other.

In an embodiment, the plurality of first heater wires may be disconnected from each other at a boundary of the plurality of holes, and the plurality of second heater wires may be disconnected from each other at the boundary of the plurality of holes.

In an embodiment, a part of the plurality of first heater wires may thermally expand a part of the plurality of first grids by being heated based on the current or the voltage, and a part of the plurality of second heater wires may thermally expand a part of the plurality of second grids by being heated based on the current or the voltage.

In an embodiment, the mask may thermally expand the part of the plurality of first grids and thermally expand the part of the plurality of second grids during the deposition process of the emission layer.

In an embodiment, the emission layer may be a partial layer of an OLED disposed on a semiconductor wafer substrate.

In an embodiment, the plurality of first heater wires and the plurality of second heater wires may be disposed to face the deposition source.

In an embodiment, the plurality of first heater wires and the plurality of second t heater wires may be disposed between the magnetic substrate and the mask.

In accordance with the mask according to embodiments and the deposition apparatus including the mask, the PPA may be improved to improve the reliability and reduce the cost.

BRIEF DESCRIPTION OF THE DRAWINGS

The above and other features of the disclosure will become more apparent by describing in detail embodiments thereof with reference to the accompanying drawings, in which:

FIG. 9 is a perspective view of a mask according to an embodiment;

DETAILED DESCRIPTIONS

Figure 1:
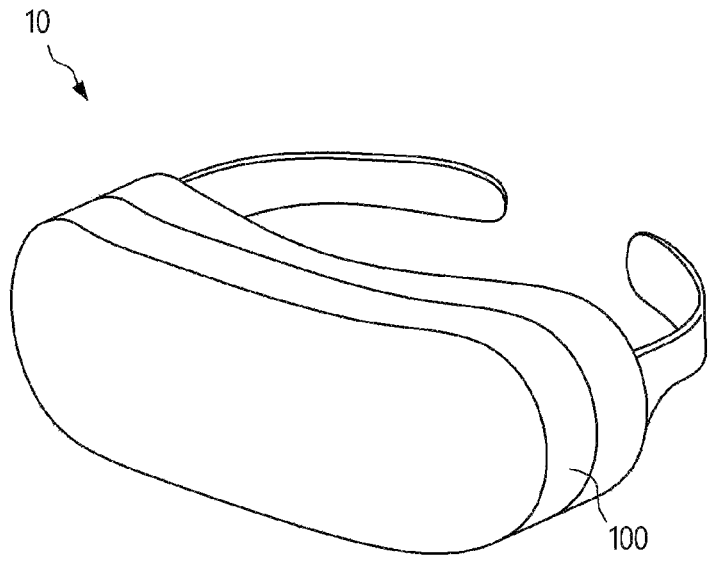
FIG. 1 shows a front perspective view of a wearable device including a display device according to an embodiment.

The invention will now be described more fully hereinafter with reference to the accompanying drawings, in which various embodiments are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. Like reference numerals refer to like elements throughout.

It will also be understood that when a layer is referred to as being "on" another layer or substrate, it can be directly on the other layer or substrate, or intervening layers may be present therebetween. In contrast, when an element is referred to as being "directly on" another element, there are no intervening elements present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of the invention will be described with reference to the accompanying drawings.

Figure 2:
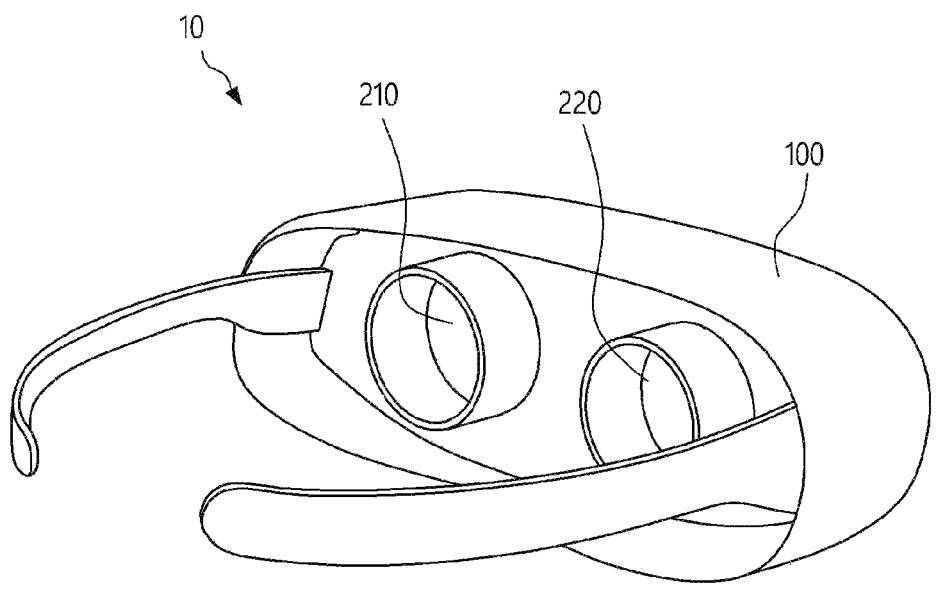
FIG. 2 shows a rear perspective view of the wearable device shown in FIG. 1.

FIG. 1 shows a front perspective view of a wearable device 100 including a display device 10 according to an embodiment. FIG. 2 shows a rear perspective view of the wearable device 100 shown in FIG. 1.

Referring to FIGS. 1 and 2, the display device 10 according to an embodiment may be a display device included in a wearable device 100, where the wearable device 100 is an HMD device. In an embodiment where the wearable device 100 is the HMD device, the display device 10 is disposed inside the body, and lenses 200 for displaying the images may be disposed on the rear surface of the body. The lens 200 may include a left eye lens 210 associated with the user's left eye, and a right eye lens 220 associated with the user's right eye. Each of the left eye lens 210 and the right eye lens 220 may include glass for displaying images output from the display device 10. A method of displaying images through the glass of the display device 10 will be described in detail later with reference to FIG. 5.

Figure 3:
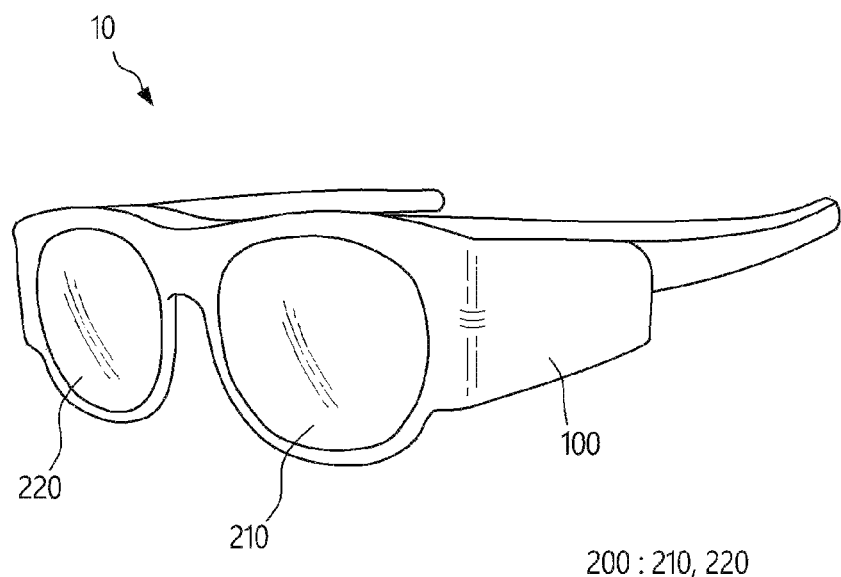
FIG. 3 shows a front perspective view of a wearable device including a display device according to an alternative embodiment.

FIG. 3 shows a front perspective view of the wearable device 100 including the display device 10 according to an alternative embodiment.

Referring to FIG. 3, the display device 10 according to an embodiment may be a display device included in the wearable device 100, where the wearable device 100 is AR glasses. The AR glasses have a shape of glasses and may include see-through lenses. The see-through lenses 200 may include a left eye lens 210 associated with the user's left eye, and a right eye lens 220 associated with the user's right eye. Each of the left eye lens 210 and the right eye lens 220 may include glass for displaying images output from the display device 10. A method of displaying images through the glass of the display device 10 will be described later in detail with reference to FIG. 5.

Figure 4:
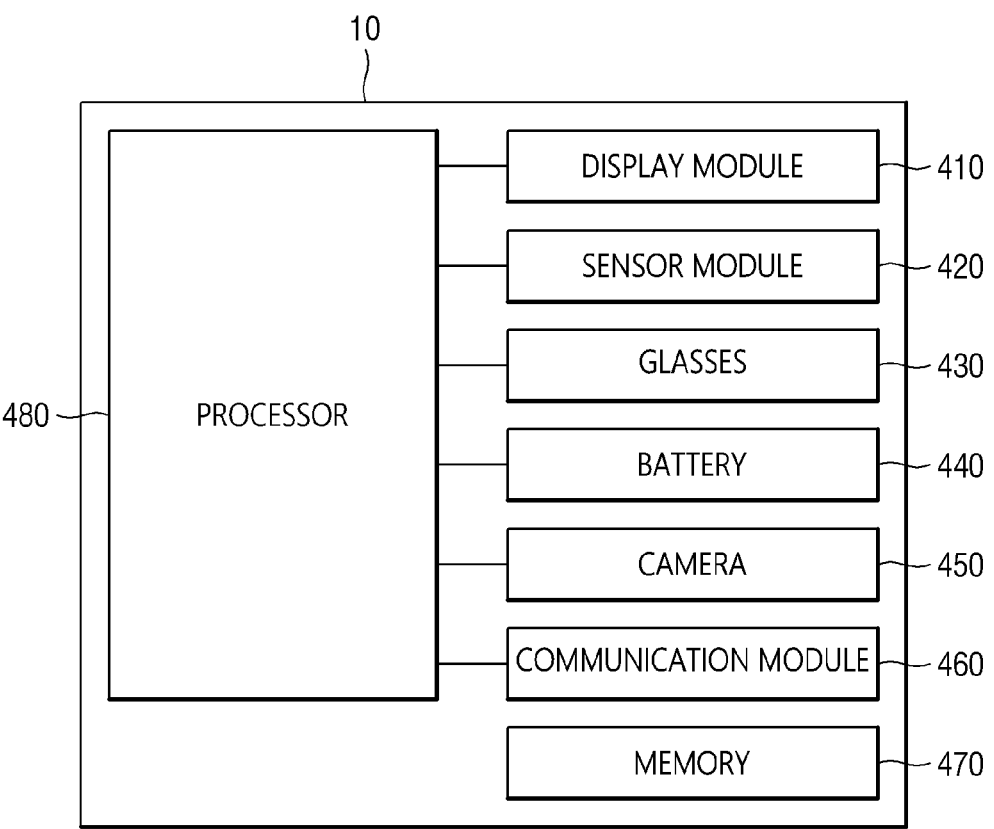
FIG. 4 is a block diagram of a display device according to an embodiment.
Figure 5:
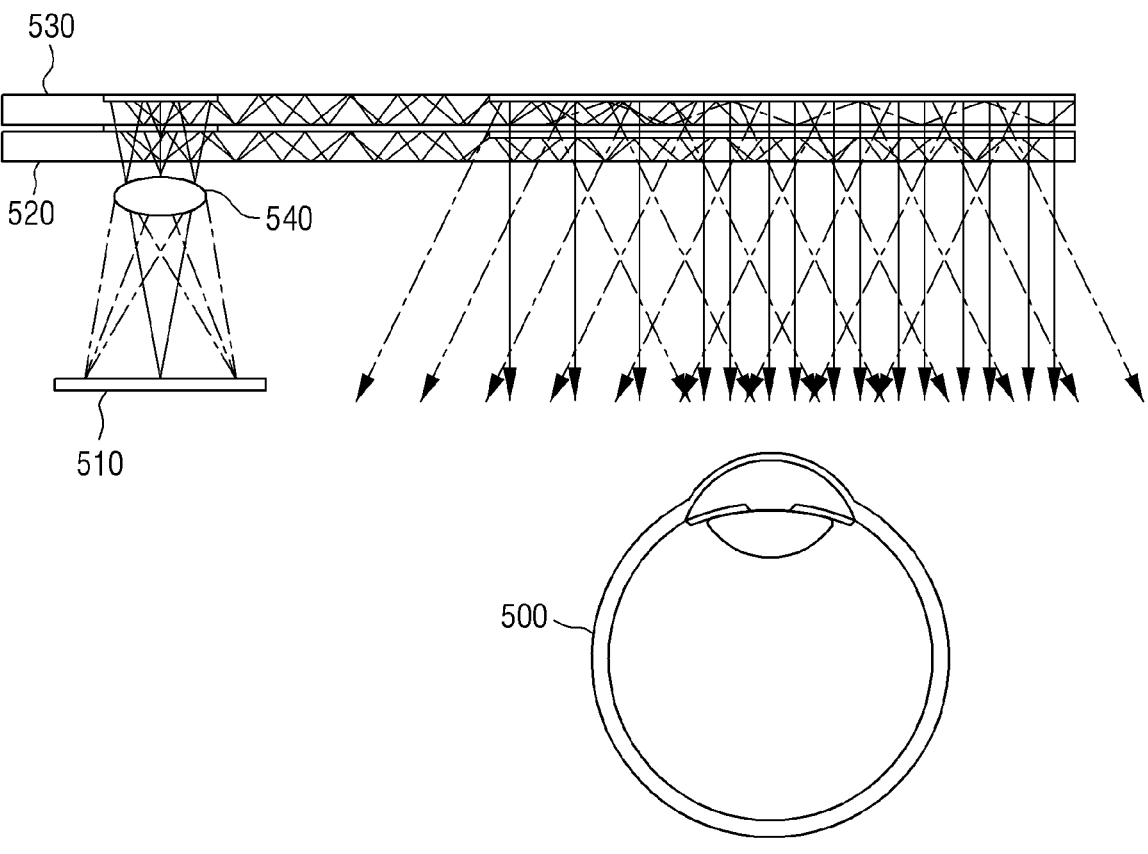
FIG. 5 is a view showing a configuration of a display module according to an embodiment.

FIG. 4 is a block diagram of a display device 10 according to an embodiment. FIG. 5 is a view showing a configuration of a display module according to an embodiment. For example, FIG. 5 shows optical paths along which display lights output from a display panel 510 of the display device 10 move.

An embodiment of the display device 10 shown in FIGS. 4 and 5 may be applied to the HMD device shown in FIGS. 1 and 2 or the AR glasses shown in FIG. 3.

Referring to FIGS. 4 and 5, the display device 10 according to an embodiment may include a processor 480, a display module 410, a sensor module 420, glasses 430, a battery 440, a camera 450, and a communication module 460. Although not shown in FIG. 4, the display device 10 may further include other elements described herein. At least some of the elements shown in FIG. 4 may be omitted from the display device 10.

The processor 480 may execute instructions stored in a memory 470 to control the operations of the elements of the display device 10 (e.g., the display module 410, the sensor module 420, the battery 440, the camera 450 and the communication module 460). The processor 480 may be electrically and/or operatively connected to the display module 410, the sensor module 420, the battery 440, the camera 450 and the communication module 460. The processor 480 may execute software to control at least one selected from the other elements connected to the processor 480 (e.g., the display module 410, the sensor module 420, the battery 440, the camera 450 and the communication module 460). The processor 480 may obtain instructions from the elements included in the display device 10, may interpret the obtained instructions, and may process and/or calculate various data according to the interpreted commands.

The display device 10 may receive processed data from an external device (not shown) through the processor 480 incorporated into the external device (e.g., a smart phone or a tablet PC). In an embodiment, for example, the display device 10 may capture an object (e.g., a real world object or a user's eye) through the camera 450 and may transmit the captured image to an external device via the communication module 460. The display device 10 may receive data based on the image captured by the display device 10 from the external device. The external device may generate image data associated with AR based on the information on the captured object (e.g., shape, color, or location) received from the display device 10 and transmit it to the display device 10. The display device 10 may request additional information based on the image of the object (e.g., a real world object or a user's eye) captured through the camera 450 to an external device, and may receive additional information from the external device.

The display module 410 may include a display panel (e.g., the display panel 510 of FIG. 5), and light transmission members (e.g., waveguides 520 and 530) that transmit light exiting from the display panel 510 to a portion of the glass 430. Herein, the display panel 510 may refer to a light source unit that generates display lights input to the waveguides (e.g., 520 and 530 of FIG. 5). The display panel 510 may be a display panel to which organic light emitting diode on silicon (OLEDoS) technology is applied. In an embodiment, for example, the display panel may include an organic light-emitting diode (OLED) disposed on a semiconductor wafer substrate on which a complementary metal oxide semiconductor (CMOS) is disposed.

The display panel 510 of the display module 410 may emit display light for displaying an AR image (or VR image)

under the control of the processor 480. In an embodiment, for example, the display light emitted from the display panel 510 may be transferred to the display area of the lens (200 in FIG. 2 or 200 in FIG. 3) through the waveguides 520 and 530, so that the user can see the display light. The display device 10 (e.g., the processor 480) may control the display panel 510 in response to a user's input. Types of user input may include button input, touch input, voice input, and/or gesture input, but the disclosure is not limited thereto. Various input means capable of controlling the operation of the display panel 510 may be included.

The display device 10 may further include a light source unit (not shown) to track the movement of the user's eye 500. The light source unit may emit light different from display light output by the display panel 510. The light source unit may irradiate near-infrared light having an output wavelength of about 780 nanometers (nm) to about 1400 nm to the user's eyes. The near-infrared light emitted from the light source unit may be reflected off the user's eye 500, and the reflected near-infrared light may be input to the display panel 510. The display panel 510 may include an eye tracking sensor (e.g., a sensor pixel SS of FIG. 6) as an optical sensor for receiving near-infrared light reflected from the user's eye 500 and tracking the movement of the user's eye 500 using the input near-infrared light. The eye tracking sensor may include a photodiode (not shown) disposed in a sensor pixel of the display panel 510.

The glass 430 may be disposed to correspond to the display area of the lens (200 in FIG. 2 or 200 in FIG. 3) of the wearable device. In an embodiment, for example, the glass 430 may be included in each of the left eye lens (210 in FIG. 1 or 210 in FIG. 3) and the right eye lens (220 in FIG. 1 or 220 in FIG. 3).

The glasses 430 may include waveguides 520 and 530. The waveguides 520 and 530 may include at least one of a display waveguide 520 and an eye tracking waveguide 530.

The display waveguide (e.g., a first waveguide) 520 may guide the display light exiting from the display panel 510 toward the display area of the lens (200 in FIG. 2 or 200 in FIG. 3) to form light paths. In an embodiment, for example, the display area of the lens (200 in FIG. 2 or 200 in FIG. 3) may be an area where lights propagating inside the display waveguide 520 exit.

The display waveguide 520 may include at least one selected from at least one diffractive element or at least one reflective element (e.g., a reflective mirror). The display waveguide 520 may guide display light exiting from the display panel 510 to the user's eye 500 by using at least one diffractive element or reflective element included in the display waveguide 520. In an embodiment, for example, the diffractive element may include an input/output grating, and the reflective element may include total internal reflection (TIR). An optical material (e.g., glass) may be processed into a wafer and used as the display waveguide 520. The refractive index of the display waveguide 520 may be in a range from about 1.5 to about 1.9.

The display waveguide 520 may include a material (e.g., glass or plastic) that can totally reflect the display light to guide the display light to the user's eye 500. The material of the display waveguide 520 may not be limited to the above example.

The display waveguide 520 may split the display lights exiting from the display panel 510 by wavelength (e.g., blue, green, or red) and may allow the split display lights to travel in different paths, respectively, within the display waveguide 520.

The display waveguide 520 may be disposed on a portion of the glass 430. In an embodiment, for example, the display waveguide 520 may be disposed at the upper end of the glass 430 with respect to an imaginary axis in line with the center point of the glass 430 and the center point of the user's eye 500 and an imaginary line perpendicular to the virtual axis and the center point of the glass 430. The area where the display waveguide 520 is disposed may not be limited to the above-described area of the glass 430. The display waveguide 520 may be disposed any area of the glass 430 as long as the amount of lights reflected off the user's eye 500 is equal to or greater than the reference value.

The sensor module 420 may include at least one sensor (e.g., an eye tracking sensor and/or an illuminance sensor). At least one sensor may not be limited to the above examples. In an embodiment, for example, the at least one sensor may include a proximity sensor or a contact sensor capable of detecting whether the display device 10 is worn by the user. The display device 10 may detect whether the display device 10 is worn by the user through the proximity sensor or the contact sensor. When it is determined that the display device 10 is worn by the user, the display device 10 may manually and/or automatically pair with another electronic device (e.g., a smart phone).

The eye tracking sensor may detect reflected light reflected off the user's eye 500 under the control of the processor 480. The display device 10 may convert the reflected light detected through the eye tracking sensor into an electrical signal. The display device 10 may obtain an image of the user's eyes through the converted electrical signal. The display device 10 may track the user's eyes using the obtained image of the user's eye balls.

The illuminance sensor may detect the luminance (or brightness) around the display device 10, the amount of display lights exiting from the display panel, the brightness around the user's eyes 500, or the amount of reflected lights reflected off the user's eyes 500 under the control of the processor 480.

The display device 10 may detect the luminance (or brightness) around the user using the illuminance sensor. The display device 10 may adjust the amount of lights (or brightness) of the display (e.g., the display panel 510) based on the detected luminance (or brightness).

The eye tracking waveguide (e.g., a second waveguide) 530 may guide lights reflected off the user's eye 500 so that the reflected lights are input to the sensor module 420 to form light paths. The eye tracking waveguide 530 may be used to transfer the reflected lights to the eye tracking sensor. The eye tracking waveguide 530 may include or be formed of a same element as or a different element from the display waveguide 520.

The eye tracking waveguide 530 may be disposed on a portion of the glass 430. In an embodiment, for example, the eye tracking waveguide 530 may be disposed at the lower end of the glass 430 with respect to an imaginary axis in line with the center point of the glass 430 and the center point of the user's eye 500 and an imaginary line perpendicular to the virtual axis and the center point of the glass 430. The location of the eye tracking waveguide 530 is not limited to the above-described location of the glass 430 and may be disposed any area of the glass 430.

The battery 440 may supply power to at least one of the elements of the display device 10. The battery 440 may be charged by being wired or wirelessly connected to an external power source.

The camera 450 may capture an image around the display device 10. In an embodiment, for example, the camera 450 may capture an image of the user's eye 500 or an image of a real world object outside the display device 10.

The communication module 460 may include a wired interface or a wireless interface. The communication module 460 may support direct communications (e.g., wired communications) or indirect communications (e.g., wireless communications) between the display device 10 and an external device (e.g., a smartphone or a tablet PC).

The communication module 460 may include a wireless communication module (e.g., a cellular communication module, a near-field wireless communication module, or a global navigation satellite system (GNSS) communication module, or a wired communication module (e.g., a local area network (LAN) communication module, or a power line communication module).

The wireless communication module may support the 5G network after the 4G network and the next-generation communication technologies, for example, NR (new radio) access technology. The NR access technology may support high-speed transmission of high-capacity data (enhanced mobile broadband (eMBB)), minimization of terminal power and access of multiple terminals (massive machine type communications (mMTC)), or high reliability and low latency (ultra-reliable and low latency (URLLC) communications). A wireless communication module 192 may support a high frequency band (e.g., mmWave band) to achieve a high data rate transmission, for example.

The wireless communication module may include a near-field wireless communication module. Near-field communications may include at least one selected from: wireless fidelity (WiFi), Bluetooth, Bluetooth low energy (BLE), Zigbee, near-field communications (NFC), magnetic secure transmission, radio frequency (RF), and body area network (BAN).

Referring to FIG. 5, an embodiment of the display module 410 includes the display panel 510 that outputs display lights, the waveguides 520 and 530, and a projection lens 540.

The projection lens 540 may input light exiting from the display panel 510 to the waveguides 520 and 530. In an embodiment, as shown in FIG. 5, a part of light flux exiting from the display panel 510 is input to the waveguides 520 and 530 through the projection lens 540.

The waveguides 520 and 530 may have a plate shape. The waveguides 520 and 530 may include grating having diffractive function, such as diffraction optical elements (DOE) and holographic optical elements (HOE), in a portion of the plate. The period, depth, or refractive index of the grating of the waveguides 520 and 530 may be variously determined based on conditions such as the viewing angle of output images or the refractive index of a plate medium. The waveguides 520 and 530 may distribute optical signals input from the display panel 510 (i.e., display lights) so that some of the optical signals are transferred to the inside of the waveguide 520 and 530 while some others of the optical signals are output to the outside of the waveguides 520 and 530.

Although an embodiment where the waveguides 520 and 530 include a diffractive optical element is shown in FIG. 5, the disclosure is limited thereto. Alternatively, the waveguides may be replaced with a reflective optical element such as a beam splitter.

Figure 6:
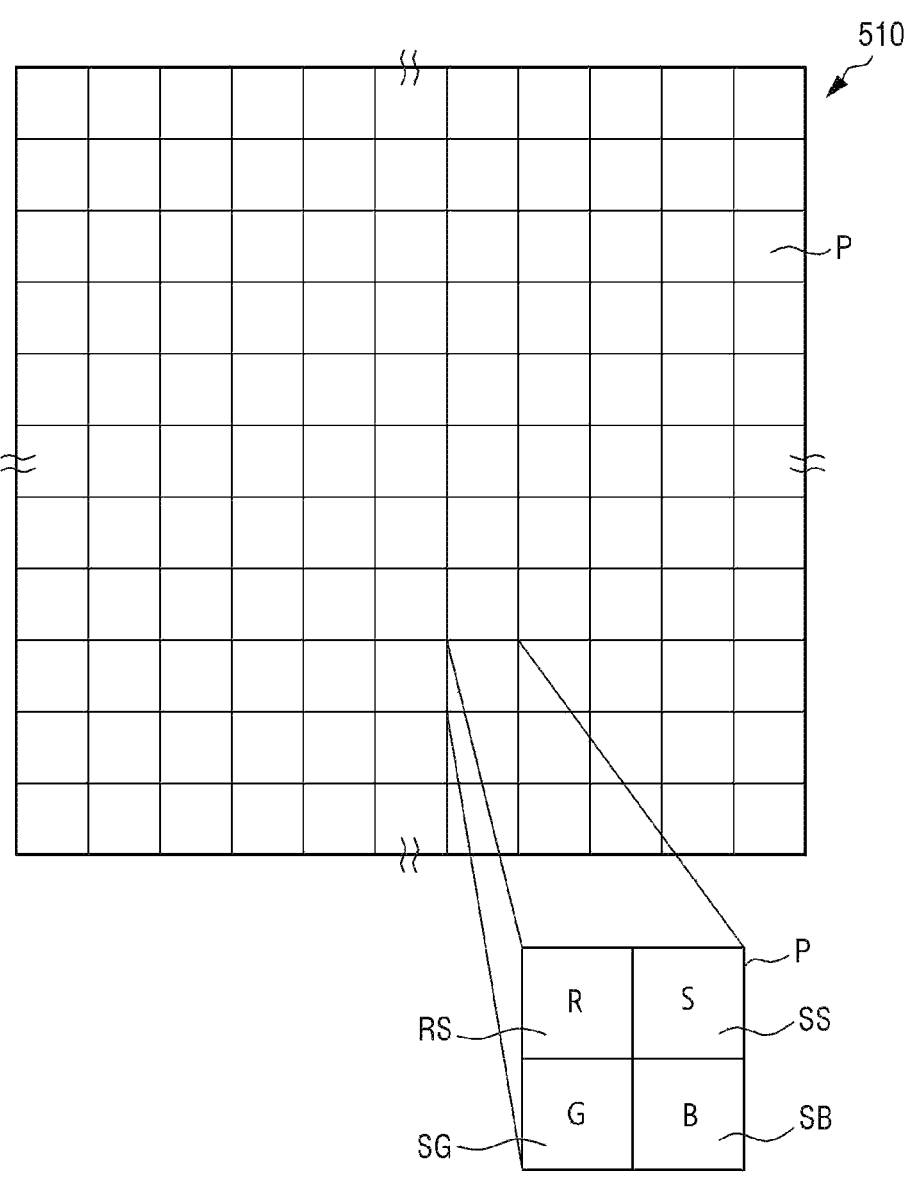
FIG. 6 is a plan view of a display panel according to an embodiment.
Figure 7:
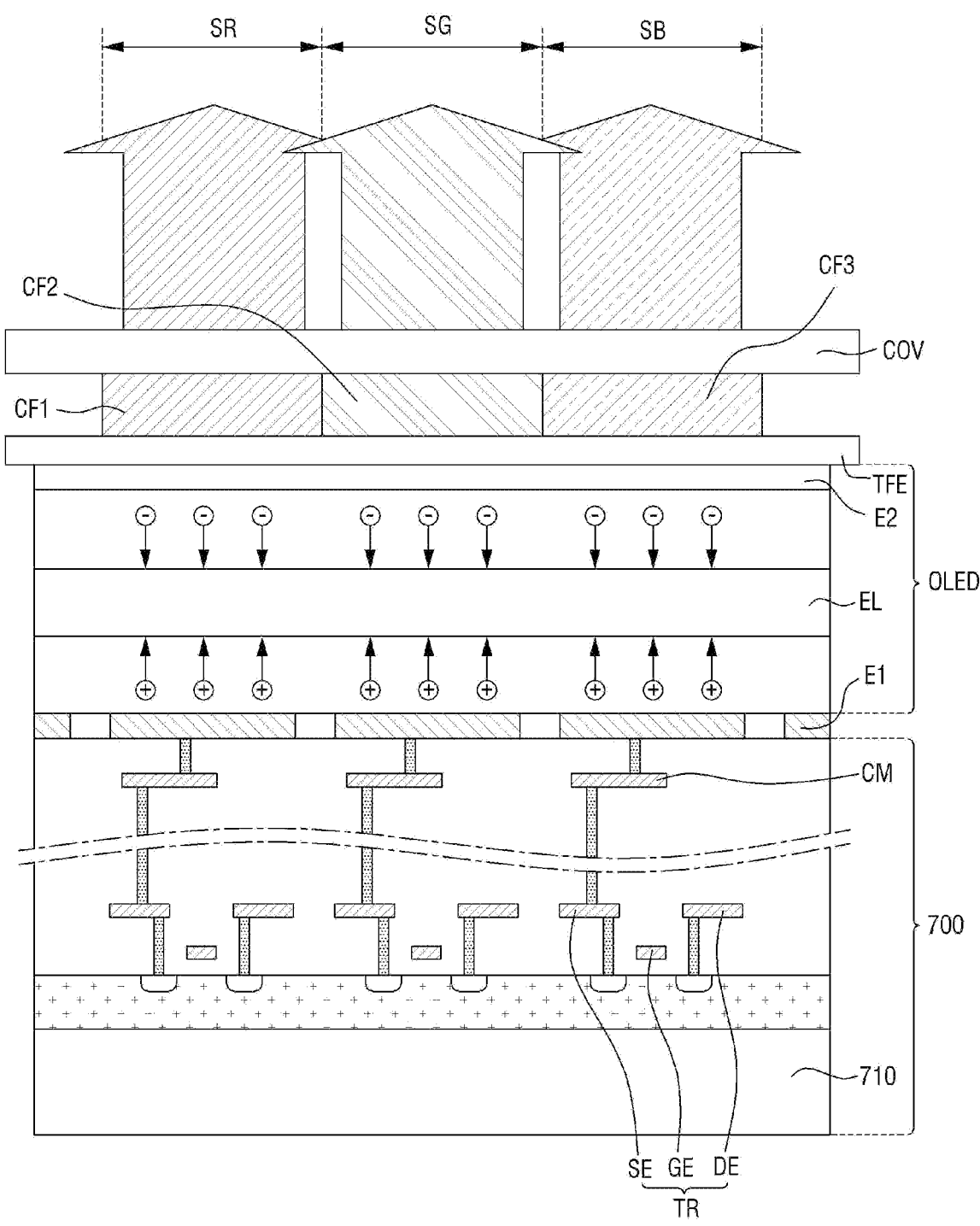
FIG. 7 is a cross-sectional view showing an emission area of a display panel according to an embodiment.

FIG. 6 is a plan view of a display panel according to an embodiment. FIG. 7 is a cross-sectional view showing an emission area of a display panel according to an embodiment.

Referring to FIG. 6, the display panel 510 according to an embodiment may include a plurality of pixel groups P. The plurality of pixel groups P may be arranged in a matrix form on the plane of the display panel 510. In an embodiment, for example, the display panel 510 may include m*n pixel groups P (e.g., unit pixels). Herein, the asterisk sign * refers to the multiplication sign.

Each of the plurality of pixel groups P may include a red pixel SR, a green pixel SG, a blue pixel SB, and a sensor pixel SS. Although an embodiment where one pixel group P includes one red pixel SR, one green pixel SG, one blue pixel SB, and one sensor pixel SS is shown in FIG. 5, the disclosure is not limited thereto, and the arrangement of pixels included in each pixel group P may be variously changed and designed.

The red pixel SR includes a red color filter CF1 and thus emits red light as the red color filter CF1 transmits the red light. According to an alternative embodiment, an emission layer EL of a red pixel SR may directly emit red light, and the red color filter CF1 may be omitted.

The green pixel SG includes a green color filter CF2 and emits green light as the green color filter CF2 transmit the green light. According to an alternative embodiment, an emission layer EL of a green pixel SG may directly emit green light, and the green color filter CF2 may be omitted.

The blue pixel SB includes a blue color filter CF3 and emits blue light as the blue color filter CF3 transmit the blue light. According to an alternative embodiment, an emission layer EL of a blue pixel SB may directly emit blue light, and the blue color filter CF3 may be omitted.

The sensor pixel SS includes a photodiode PTD, and may sense reflective light reflected from the user's eye 500. The photodiode PTD may convert the sensed reflected light into an electrical signal and supply the converted electrical signal to the sensor module 420.

Referring to FIG. 7, in an embodiment, the display panel 510 may include a semiconductor wafer substrate 700, an OLED disposed on the semiconductor wafer substrate 700, and color filters CF1, CF2 and CF3 disposed on the OLED. A thin-film encapsulation layer TFE covering the emission layer EL of the OLED may be disposed between the OLED and the color filters CF1, CF2 and CF3. A cover window COV may be disposed on the color filters CF1, CF2 and CF3. The cover window COV may be attached onto the color filters CF1, CF2 and CF3 by a transparent adhesive member (not shown) such as an optically clear adhesive (OCA) film.

The semiconductor wafer substrate 700 may include a base substrate 710 and a transistor TR disposed on the base substrate 710.

The base substrate 710 may be a silicon substrate. The base substrate 710 may be a semiconductor pattern formed on a silicon substrate. In an embodiment, for example, the base substrate 710 may be a silicon semiconductor substrate formed through a CMOS process. The base substrate 710 may include a monocrystalline silicon wafer, a polycrystalline silicon wafer, and/or an amorphous silicon wafer.

The transistor TR disposed on the base substrate 710 may include a gate electrode GE, a source electrode SE, and a drain electrode DE. The transistor TR may be configured to independently control the red pixel SR, the green pixel SG and the blue pixel SB, which are included in each of the plurality of pixel groups P. A connection electrode CM, conductive lines (not shown) and conductive pads (not shown), which are electrically connected to the transistor TR, may be further disposed on the base substrate 710. The connection electrode CM, the conductive lines and the conductive pads may include a conductive material, for example, a metal material.

The sensor pixel SS may include a photodiode (not shown). An electrical signal of the photodiode may be delivered may be transferred to the processor 480 through the read-out line (not shown).

The OLED, which includes a first electrode E1, an emission layer EL, and a second electrode E2, may be disposed on the semiconductor wafer substrate 700.

The first electrodes E1 may be electrically connected to the transistor TR through the connection electrode CM of the semiconductor wafer substrate 700 and at least one contact hole connected thereto. The first electrodes E1 may be anode electrodes for driving the emission layer EL of each of the red pixel SR, the green pixel SG and the blue pixel SB. The first electrodes E1 may be reflective electrodes. In an embodiment, for example, the first electrodes E1 may reflect light emitted from the emission layer EL toward a downward direction. The first electrodes E1 may include a metal material having high light reflectance. In an embodiment, for example, the first electrodes E1 may include at least one selected from Al, Al/Cu and Al/TiN. The first electrodes E1 may not be formed in the sensor pixel SS. That is, the sensor pixel SS may not include the first electrodes E1.

The emission layer EL may be disposed on the first electrodes E1. The emission layer EL may be defined by a single layer or have a stacked structure including a plurality of layers. The emission layer EL may be configured to emit white light. The white light may be, for example, light in which blue light, green light, and red light are mixed. Alternatively, the white light may be light in which blue light and yellow light are mixed. The emission layer EL may not be formed in the sensor pixel SS. That is, the sensor pixel SS may not include the emission layer EL.

Figure 8:
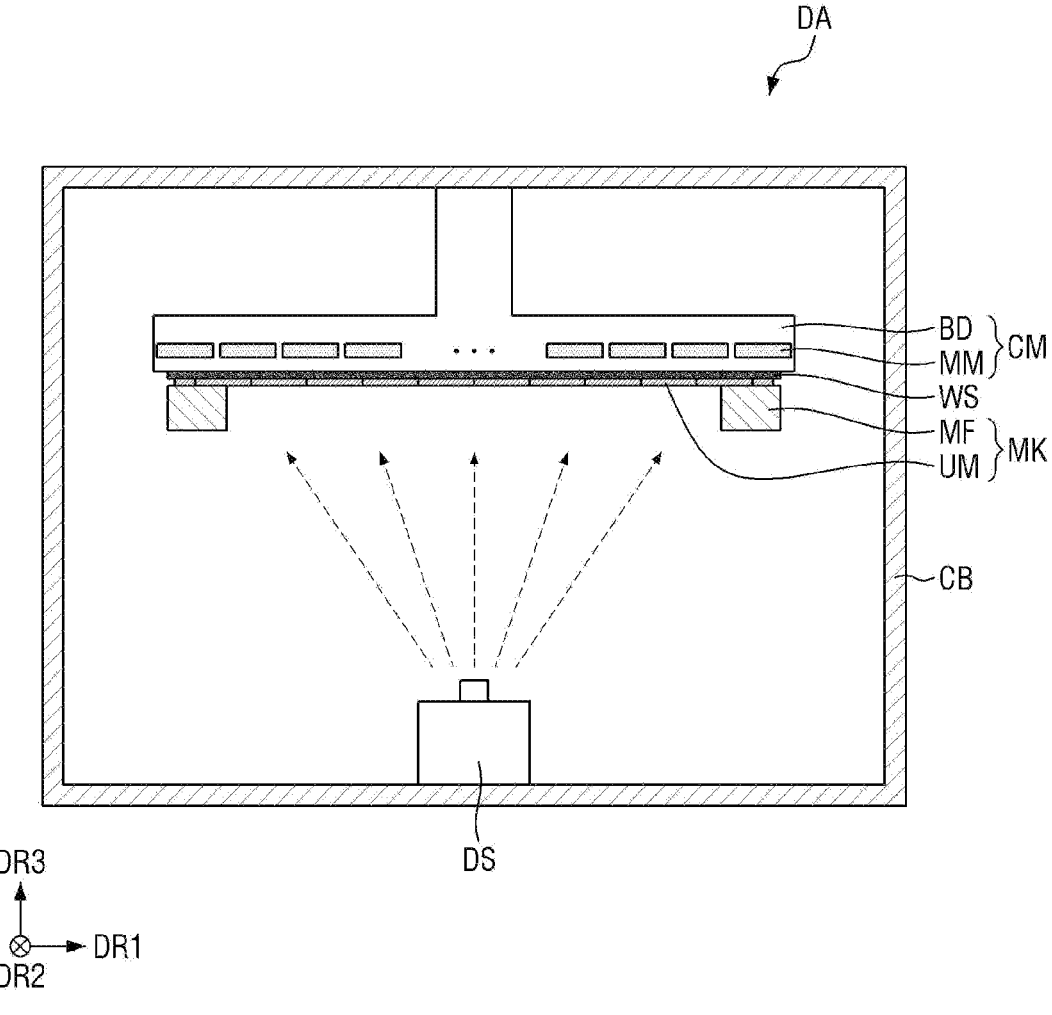
FIG. 8 is a cross-sectional view of a deposition apparatus according to an embodiment of the disclosure.

The second electrode E2 may be disposed on the emission layer EL. The second electrode E2 may be a common electrode, for example, a cathode electrode. The second electrode E2 may be a transmissive or transflective electrode. In an embodiment, for example, the second electrode E2 may transmit light emitted from the emission layer EL. The second electrode E2 may include a conductive material. In an embodiment, for example, the second electrode E2 may include Li, Ca, LiF/Ca, LiF/Al, Al, Mg, BaF, Ba, Ag, Au, Cu, or a compound or mixture thereof, which has a low work function. In an embodiment, as shown in FIG. 8, the second electrode E2 may not be formed in the sensor pixel SS. That is, the sensor pixel SS may not include the second electrode E2.

The thin-film encapsulation layer TFE may be disposed on the OLED. The thin-film encapsulation layer TFE may be configured to encapsulate the emission layer EL so that oxygen or moisture may be prevented from being permeated into the emission layer EL. The thin-film encapsulation layer TFE may be disposed on an upper surface and sides of the emission layer EL. The thin-film encapsulation layer TFE may include at least one inorganic layer to prevent oxygen or moisture from being permeated into the emission layer EL. In addition, the thin-film encapsulation layer TFE may include at least one organic layer to protect the emission layer EL from particles such as dust. The inorganic layer of the thin-film encapsulation layer TFE may be formed of a multi-layer in which one or more inorganic layers, e.g., a silicon nitride layer, a silicon oxynitride layer, a silicon oxide layer, a titanium oxide layer or an aluminum oxide layer, are alternately stacked. The organic layer of the thin-film encapsulation layer TFE may be an organic layer including an organic material such as an acryl resin, an epoxy resin, a phenolic resin, a polyamide resin, or a polyimide resin.

The color filters CF1, CF2 and CF3 may be disposed on the thin-film encapsulation layer TFE. The color filters CF1, CF2 and CF3 may include a red color filter CF1 (e.g., a first color filter) that transmits red light, a green color filter CF2 (e.g., a second color filter) that transmits green light, and a blue color filter CF3 (e.g., a third color filter) that transmits blue light. The red color filter CF1 may be disposed to correspond to the red pixel SR, thereby transmitting red light among the white light emitted from the emission layer EL of the red pixel SR. The green color filter CF2 may be disposed to correspond to the green pixel SG, thereby transmitting green light among the white light emitted from the emission layer EL of the green pixel SG. The blue color filter CF3 may be disposed to correspond to the blue pixel SB, thereby transmitting blue light among the white light emitted from the emission layer EL of the blue pixel SB. The color filters CF1, CF2 and CF3 may not be formed in the sensor pixel SS. That is, the sensor pixel SS may not include the color filters CF1, CF2 and CF3.

FIG. 8 is a cross-sectional view of a deposition apparatus according to an embodiment of the disclosure. The deposition apparatus shown in FIG. 8 may be used in a deposition process of the display panel 510 and the emission layer EL described with reference to FIG. 7. The emission layer EL may emit different colors from each of the red pixel SR, green pixel SG, and blue pixel SB. In an embodiment, for example, the emission layer EL may emit red light from the red pixel SR, may emit green light from the green pixel SG, or may emit blue light from the blue pixel SB.

Referring to FIG. 8, a deposition apparatus (or deposition facility) DA according to an embodiment may include a deposition chamber CB, a fixing member CM, a deposition source DS disposed inside the deposition chamber CB, and a mask MK disposed inside the deposition chamber CB.

The deposition chamber CB may change a deposition environment (e.g., an environment inside the deposition chamber CB) to a vacuum. The deposition chamber CB may include a bottom surface, a ceiling surface, and side walls. The bottom surface of the deposition chamber CB is parallel to a surface defined by a first direction DR1 and a second direction DR2. A normal direction of the bottom surface of the deposition chamber CB is defined as a third direction DR3. Hereinafter, the first to third directions are defined as directions indicated by each of the first to third directions DR1, DR2, and DR3 in FIG. 8, and refer to the same reference numerals. "On a plane" expressed hereafter is set based on a surface parallel to the surface defined by the first direction DR1 and second direction DR2. That is, the phrase "on a plane" may mean when viewed in the third direction DR3.

The fixing member (or a fixing apparatus) CM is disposed inside the deposition chamber CB, and is disposed to face the deposition source DS. The fixing member CM serves to fix the mask MK. The fixing member CM may be installed on (or fixed onto) the ceiling surface of the deposition chamber CB. The fixing member CM may include a jig (not shown) or a robot arm (not shown) for holding the mask MK.

The fixing member CM may include a body portion BD and a magnetic substrate MM coupled to the body portion BD. The body portion BD may include a plate as a basic structure for fixing the mask MK, but the disclosure is not limited thereto. The magnetic substrate MM may be disposed inside the body portion BD, but alternatively, a part of the magnetic substrate MM may be disposed outside the body portion BD. The magnetic substrate MM may fix the mask MK with magnetic force.

The deposition source DS may evaporate a deposition material, for example, a light emitting material, and eject the deposition material as deposition vapor. The corresponding deposition vapor passes through the mask MK and is deposited on a work substrate WS in a predetermined pattern. Here, the work substrate WS may be the semiconductor wafer substrate 700 described above with reference to FIG. 7.

The mask MK may be disposed inside the deposition chamber CB and may be fixed by the fixing member CM to face the deposition source DS. The mask MK may support the work substrate WS.

The mask MK includes a plurality of unit masks UM and a mask frame MF. The plurality of unit masks UM may be combined with the mask frame MF to be provided. A detailed description thereof will be given later.

Figure 9:
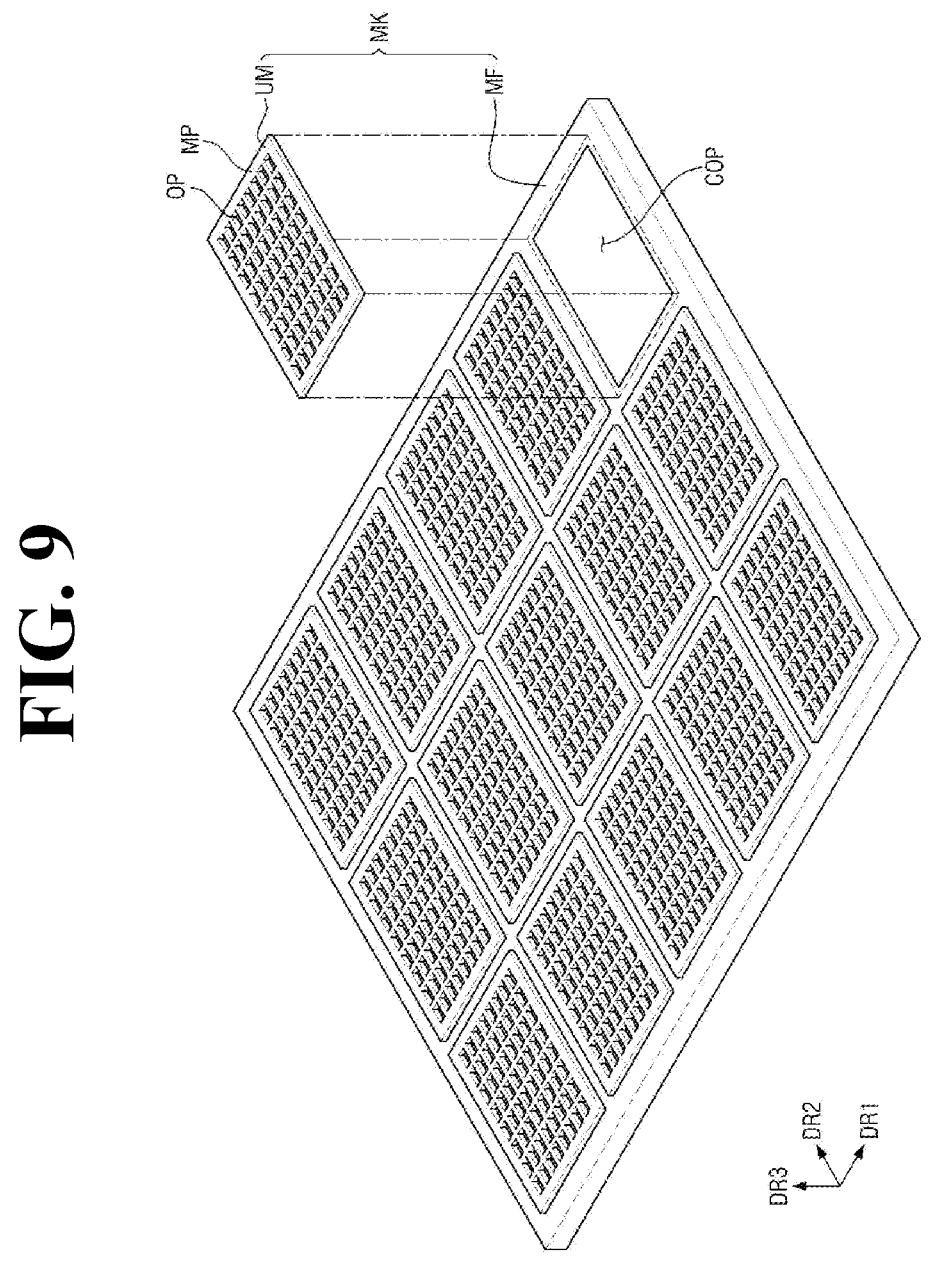

FIG. 9 is a perspective view of a mask according to an embodiment. FIG. 9 is a perspective view showing a state in which one unit mask UM is separated from the plurality of unit masks UM.

Referring to FIG. 9, an embodiment of the mask MK may include a mask frame MF and a plurality of unit masks UM. A plurality of cell openings COP may be defined in the mask frame MF, each formed through the mask frame MF in the third direction DR3. The unit masks UM may be disposed to correspond to the cell openings COP, respectively. Each of the cell openings COP may correspond to one display panel 510. That is, one unit mask UM may be used in a deposition process of one display panel 510. In the disclosure, the term "unit mask" may be referred to as another term such as a mask unit UM.

Each of the plurality of unit masks UM may include a mask body MP provided with a plurality of holes OP defined therethrough. The plurality of holes OP may be formed in the mask body MP, and the plurality of holes OP may be arranged in a matrix form. The plurality of holes OP may pass through the unit masks UM in the third direction DR3. The mask body MP of each of the plurality of unit masks UM may include a plurality of first mask grids (MG1 of FIG. 10) extending along the first direction DR1 and disposed to be spaced apart from each other. In addition, each of the plurality of unit masks UM may include a plurality of second mask grids (MG2 of FIG. 10) extending along the second direction DR2 and disposed to be spaced apart from each other. The plurality of first mask grids (MG1 of FIG. 10) and the plurality of second mask grids (MG2 of FIG. 10) are disposed to cross each other, thereby defining the plurality of holes OP.

The plurality of unit masks UM may be disposed on the mask frame MF. The plurality of unit masks UM and the plurality of cell openings COP may be disposed to correspond in a one-to-one manner.

In an embodiment, on a plane (e.g., a surface defined by the first direction DR1 and the second direction DR2 or when viewed in the third direction DR3), the area of the mask body MP of the unit mask UM and the area of the cell opening COP may be the same as each other.

Although not illustrated in FIG. 9, each of the plurality of unit masks UM according to an embodiment may include a heater wire apparatus (HD of FIG. 10) to improve deposition accuracy, for example, pixel position accuracy (hereinafter, will be referred to as "PPA"). The heater wire apparatus HD may include a plurality of heater wires (HW of FIG. 10) disposed around the cell opening COP, a first wires (HL1 of FIG. 10) and second wires (HL2 of FIG. 10) for applying current or voltage to the plurality of heater wires HW. Each of the plurality of unit masks UM according to an embodiment may include the heater wires (HW of FIG. 10) for heating mask grids (MG1 and MG2 of FIG. 10) which defines cell openings COP so that a PPA on which a deposition material is deposited on the work substrate WS (e.g., the semiconductor wafer substrate 700) is improved. Such heater wires HW serve to adjust the width (e.g., displacement) of each of the mask grids MG1 and MG2 by adjusting the temperature of the mask grids MG1 and MG2 defining one cell opening COP. When the width of each of the mask grids MG1 and MG2 is adjusted, the area of the cell opening COP is changed, and accordingly, the amount of deposition material deposited on the work substrate WS (e.g., the semiconductor wafer substrate 700) can be precisely adjusted. Such heater wire apparatus HD will be described later in detail with reference to FIGS. 10 to 11.

Figure 10:
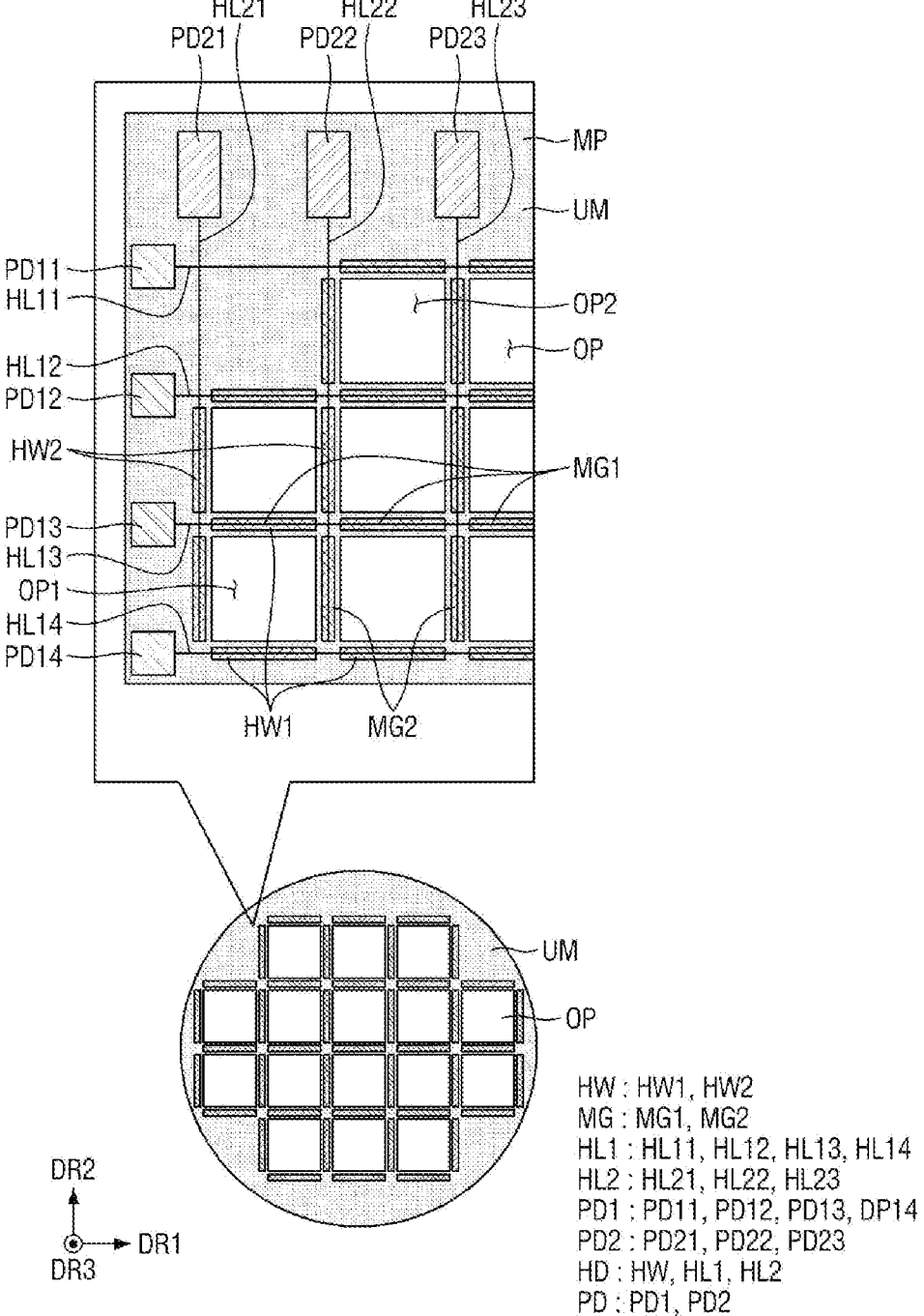
FIG. 10 is a plan view showing a part of a unit mask according to an embodiment.

FIG. 10 is a plan view showing a part of a unit mask according to an embodiment.

Referring to FIG. 10, a unit mask UM according to an embodiment may include a mask body MP provided with a plurality of holes OP defined therein. The mask body MP includes a plurality of first mask grids MG1 extending along the first direction DR1 and a plurality of second mask grids MG2 extending along the second direction DR2 perpendicular to the first direction DR1. The plurality of first mask grids (MG1 of FIG. 10) and the plurality of second mask grids (MG2 of FIG. 10) may be disposed to cross each other, thereby defining the plurality of holes OP. In an embodiment, for example, one hole OP may be defined by two first mask grids MG1 disposed at intervals and two second mask grids MG2 disposed to cross the first mask grids MG1.

Heater wires HW may be disposed around each of the plurality of holes OP to overlap the first mask grid MG1 and the second mask grid MG2. The heater wires HW may be heated by the first wires HL1 and the second wires HL2. The first wires HL1 and the second wires HL2 may be disposed or formed in (or directly on) different layers from each other. The first wires HL1 and the second wires HL2 may be disposed between the heater wires HW and the mask body MP. In an embodiment, for example, the first wires HL1 and the second wires HL2 may be formed to cross each other on the mask body MP, and the heater wires HW may be formed on the first wires HL1 and the second wires HL2.

The heater wires HW may be disposed on the first wires HL1 and the second wires HL2, but disposed around each of the plurality of holes OP. The heater wires HW may include a plurality of first heater wires HW1 that receives current or voltage through first wires HL1 and a plurality of second heater wires HW2 that receives current or voltage through second wires HL2. The first heater wire HW1 is configured to heat the first mask grid MG1 superimposed thereon based on the input current or voltage. The second heater wire HW2 is configured to heat the second mask grid MG2 superimposed thereon based on the input current or voltage.

First pads PD1 extending from the first wires HL1 and configured to apply current or voltage to the first wires HL1 are disposed in a first peripheral area PRA1 adjacent to the outer edge of the mask body MP. In addition, second pads PD2 extending from the second wires HL2 and configured to apply current or voltage to the second wires HL2 are disposed in a second peripheral area PRA2 adjacent to the outer edge of the mask body MP. The first peripheral area PRA1 of the mask body MP may be, for example, an area adjacent to the left edge of the mask body MP, but the disclosure is not limited thereto. The second peripheral area PRA2 of the mask body MP may be, for example, an area adjacent to an upper edge of the mask body MP, but the disclosure is not limited thereto. In an embodiment, as will be described later with reference to FIG. 11, the first pads PD1 and the second pads PD2 may contact a probe (PR of FIG. 11) of the deposition apparatus DA to apply current or voltage to the first wires HL1 and the second wires HL2.

According to an embodiment, the heater wires HW include a plurality of first heater wires HW1 disposed to overlap the first mask grids MG1 around each of the plurality of holes OP, and a plurality of second heater wires HW2 disposed to overlap the second mask grids MG2 around each of the plurality of holes OP. The plurality of first heater wires HW1 may be segmented without being connected to each other, that is, disconnected from each other. In an embodiment, for example, the plurality of first heater wires HW1 may be disposed to extend along the first direction DR1, but may be segmented at the boundary between the holes OP. Similarly, the plurality of second heater wires HW may be segmented without being connected to each other. in an embodiment, for example, the plurality of second heater wires HW may be disposed to extend along the second direction DR2, but may be segmented at the boundary between the holes OP. Accordingly, each of the plurality of holes OP may be heated by the heater wires HW, but may be heated independently.

Hereinafter, each of the plurality of holes OP heated independently by the heater wires HW will be described in detail.

FIG. 10 illustrate a first first pad PD11, a second first pad PD12, a third first pad PD13, and a fourth first pad PD14 as an example of the first pads PD1. The first to fourth first pads PD11, PD12, PD13, and PD14 may be electrically connected to a first first wire HL11, a second first wire HL12, a third first wire HL13, and a fourth first wire HL14, respectively, which are some of the plurality of first wires HL1, and may contacts a probe (PR of FIG. 11) to apply current or voltage to each of the first to fourth first wires HL11, HL12, HL13, and HL14.

FIG. 10 illustrate a first second pad PD21, a second second pad PD22, and a third second pad PD23 as an example of the second pads PD2. The first to third second pads PD21, PD22, and PD23 may be electrically connected to a first second wire HL21, a second second wire HL22, and a third second wire HL23, respectively, which are some of the plurality of second wires HL2, and may contacts the probe (PR of FIG. 11) to apply current or voltage to each of the first to third second wires HL21, HL22, and HL23.

In FIG. 10, "OP1" is defined as a first hole OPT disposed at the intersection of the first mask grids MGT overlapping the third and fourth first wires HL13 and HL14, and second mask grids MG2 overlapping the first and second second wires HL21 and HL22.

In FIG. 10, "OP2" is defined as a second hole OP2 disposed at the intersection of the first mask grids MGT overlapping the first and second first wires HL11 and HL12, and second mask grids MG2 overlapping the second and third second wires HL22 and HL23.

The deposition apparatus DA may apply current or voltage to the third and fourth first pads PD13 and PD14, which are parts of the first pads PD1, and may apply current or voltage to first and second second pads PD21 and PD22, which are parts of the second pads PD2, through the probe PR. In this case, the current or voltage applied to the third and fourth first pads PD13 and PD14 may heat the first wirings HW1 overlapping the first mask grids MGT disposed around the first hole OP1 through the third and fourth first wires HL13 and HL14, which are the first wirings HL1. Here, the first heater wires HW1 may mean heater wires disposed on each of the upper and lower sides of the first hole OP1. In addition, the current or voltage applied to the first and second second pads PD21 and PD22 may heat the second wirings HW2 overlapping the second mask grids MG2 disposed around the first hole OP1 through the first and second second wires HL21 and HL22, which are the second wirings HL2. Here, the second heater wires HW2 may mean heater wires disposed on each of the left and right sides of the second hole OP2. Accordingly, the mask grids MG surrounding the top, bottom, left, and right sides of the first hole OP1 may be heated by the first and second heater wires HW1 and HW2, and the width (e.g., W1 of FIG. 11) of each of the mask grids MG may be adjusted by a specified first displacement based on a coefficient of thermal expansion (CTE). In an embodiment, for example, when the mask grids MG surrounding the upper, lower, left, and right sides of the first hole OP1 are heated by the heater wires HW, the width (W1 of FIG. 11) of the mask grids MG may increase, and accordingly, the width (or area) (e.g., W2 of FIG. 11) of the first hole OP1 may decrease. In such an embodiment, when the width W2 of the first hole OP1 decreases, the thickness or the amount of a deposition material (e.g., organic material) deposited on a part of the working substrate WS (e.g., semiconductor wafer substrate 700) corresponding to the first hole OP1 may be adjusted.

In an embodiment, the deposition apparatus DA may apply current or voltage to the third and fourth first pads PD13 and PD14, which are parts of the first pads PD1, through the probe PR, and while applying current or voltage to first and second second pads PD21 and PD22, which are parts of the second pads PD2, current or voltage may not be applied to the remaining pads. Accordingly, while the mask grids MG around the first hole OP1 are heated, the temperature of the mask grids MG around the second hole OP2 may be relatively low. Since the mask grids MG around the second hole OP2 have a relatively low temperature, the width of the mask grids MG may be adjusted by a specified second displacement based on the coefficient of thermal expansion (CTE) corresponding to the mask material. In this case, the second displacement may be smaller than the first displacement, and accordingly, the width (or area) of the second hole OP2 may be greater than the width (or area) of the first hole OP1. As described above, each of the plurality of holes OP may be independently heated by the plurality of heater wires HW that are arranged to be segmented. Therefore, the deposition apparatus DA including the mask MK according to an embodiment of the disclosure may be capable of PPA adjustment in units of 1 micrometer ($\mu$m) only by adjusting the basic alignment in the equipment.

Figure 11:
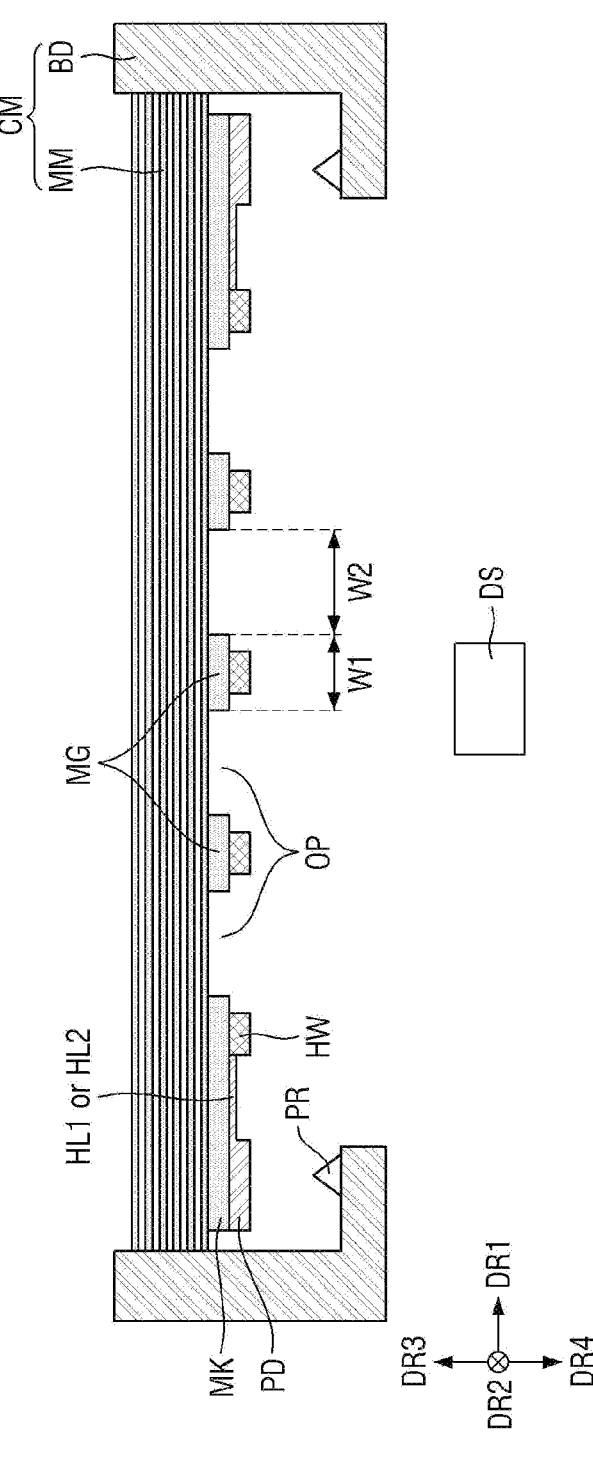
FIG. 11 is a cross-sectional view showing a part of a deposition apparatus according to an embodiment.
Figure 12:
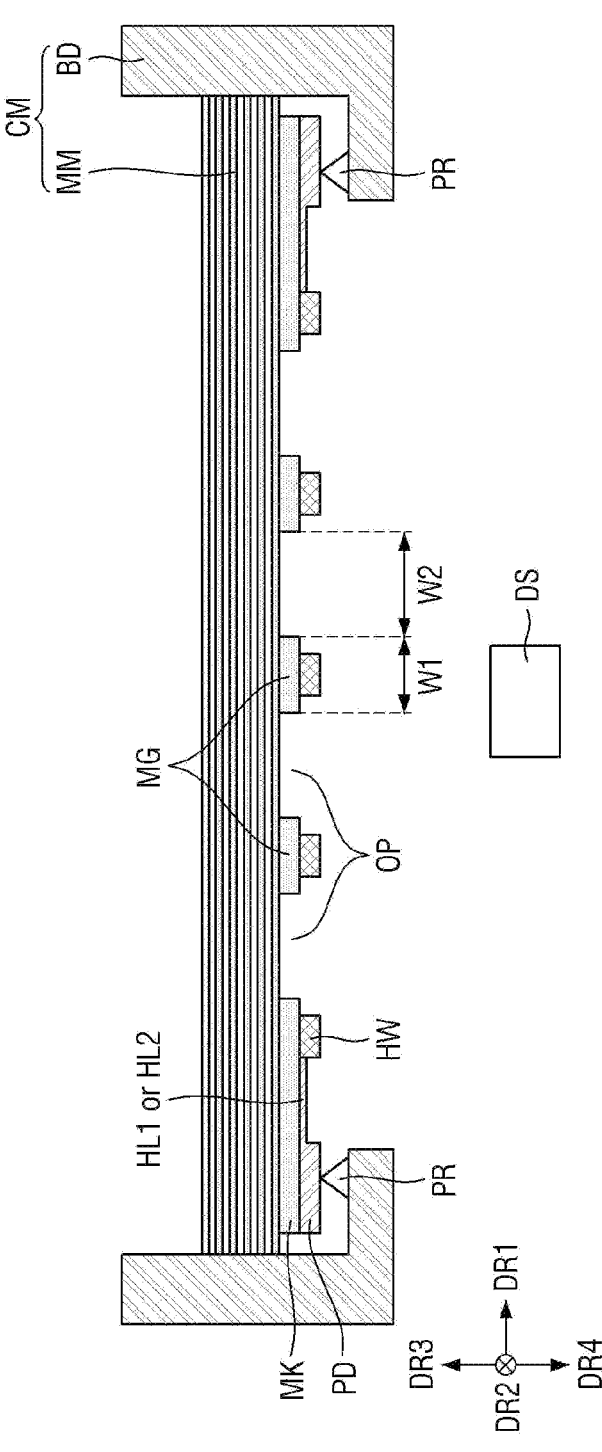
FIG. 12 is a cross-sectional view showing a state in which a pad portion of a mask and a probe are brought in to contact according to an embodiment.

FIG. 11 is a cross-sectional view showing a part of a deposition apparatus according to an embodiment. FIG. 12 is a cross-sectional view showing a state in which a pad portion of a mask and a probe are brought in to contact according to an embodiment. Particularly, FIG. 12 may show a state in which a mask according to an embodiment is loaded into a deposition apparatus.

Referring to FIGS. 11 and 12, an embodiment of the deposition apparatus DA may include a fixing member CM, and the fixing member CM may include a body portion BD and a magnetic substrate MM coupled to the body portion BD. The magnetic substrate MM is disposed inside the body portion BD and may have a plate shape. The magnetic substrate MM may fix a mask MK by using magnetic force. Such magnetic substrate MM may be a Yoke plate, but the disclosure is not limited thereto.

The mask MK may be disposed inside a deposition chamber CB and may be fixed to a predetermined position by the fixing member CM to face a deposition source DS. In such an embodiment of the mask MK, as the magnetic substrate MM of the fixing member CM moves in the vertical direction (DR4 direction), the fixing member CM may be in contact with a probe PR provided on the body portion BD.

The heater wires of the mask MK may receive current or voltage by contacting the probe PR provided on the body portion BD, and some of the heater wires to which the current or voltage is applied are heated, so that the displacement (i.e. width W1) of the mask grids MG adjacent thereto may be adjusted. To this end, the body portion BD of the fixing member CM may include a plurality of probes PR disposed to correspond to the plurality of pads PD, and each of the plurality of probes PR may be configured to independently output a current or a voltage.

According to an embodiment, each of the heater wires HW of the mask MK may include a single heater wire including or made of at least one material selected from copper fiber, carbon fiber, and alloy. In an embodiment, the alloy heater wire can induce high-temperature heat within a short period of time even under low power and can be manufactured thinly in nano unit. Alternatively, each of the heater wires HW of the mask MK may include a heater wire bundle in which a copper fiber, a carbon fiber, and an alloy heater wire are combined. The material and structure of the heater wires HW of the mask MK described above are merely one example thereof, and the disclosure is not limited thereto.

According to an embodiment, an insulating layer (not shown) or a coating layer (not shown) for reducing heat loss may be further formed around each of the heater wires HW of the mask MK (e.g., an upper part or a lower part of the heater wire), but the disclosure is not limited thereto. In an alternative embodiment, for example, an insulating layer or a coating layer may be omitted.

Figure 13:
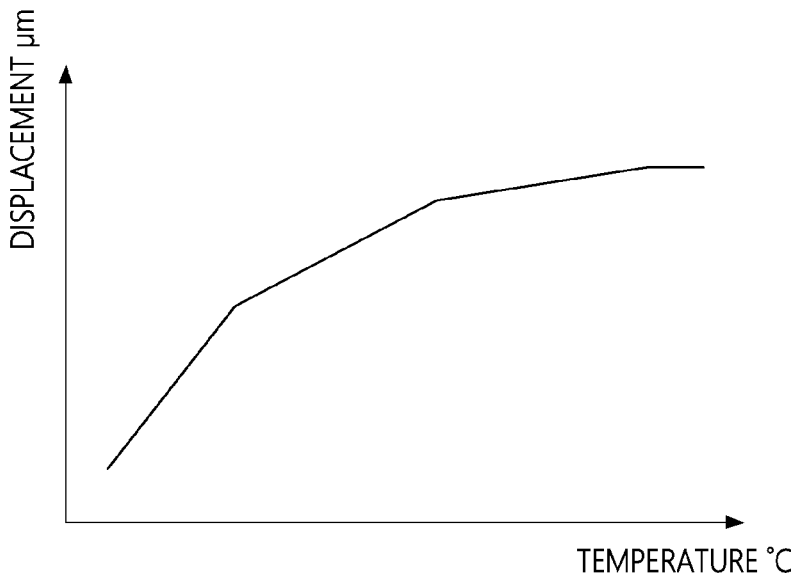
FIG. 13 is a graph showing displacement of a mask grid depending on temperature.

FIG. 13 is a graph showing displacement of a mask grid depending on temperature.

Referring to FIG. 13, the mask grid MG including or formed of a specific material may thermally expand as the heater wire adjacent thereto is heated. As shown in FIG. 13, the degree of thermal expansion of the mask grid MG may be defined as a displacement value proportional to temperature. A displacement graph of the mask grid MG according to temperature as shown in FIG. 13 may be a unique characteristic according to the material of the mask MK.

Table 1 shows materials that can be used as materials for the mask MK and thermal expansion coefficients of the corresponding materials. Therefore, displacement adjustment of the mask grid MG using the heater wire HW may be performed according to the material of the mask shown in Table 1. For example, the deposition apparatus DA may include a controller (not shown), which is not shown, and the controller may consider the material of the mask and the coefficient of thermal expansion according to the material of the mask the current and voltage applied to the plurality of probes PR. In addition, before performing the deposition process, the controller may measure the displacement of the mask by using an align key. Based on the measured displacement of the mask, the controller may select some of the plurality of probes PR so that heat is applied to a part of the mask grids requiring displacement adjustment. The controller may add the heater wires HW overlapping the mask grids requiring displacement adjustment by applying current or voltage through the selected probes PR. Accordingly, the mask grids requiring displacement adjustment are thermally expanded by a specified width due to the heating of the heater wire HW, and the PPA in the deposition process may be improved.

TABLE 1

| Material | Composition | Coefficient of thermal expansion (ppm/K) |
|---|---|---|
| silicon carbide | $SiC_x$ | 4.0~6.5 |
| silicon oxide | $SiO_x$ | 0.5~5.0 |
| silicon oxide carbide | SiOC | 10.0 |
| silicon carbide nitride | SiCN | 4.0~6.5 |
| aluminum oxide | $Al_2O_3$ | 6.0~9.0 |
| silicon nitride | $SiN_x$ | 2.0~5.4 |
| silicon oxide nitride | SiON | 0.5~5.4 |

Figure 14:
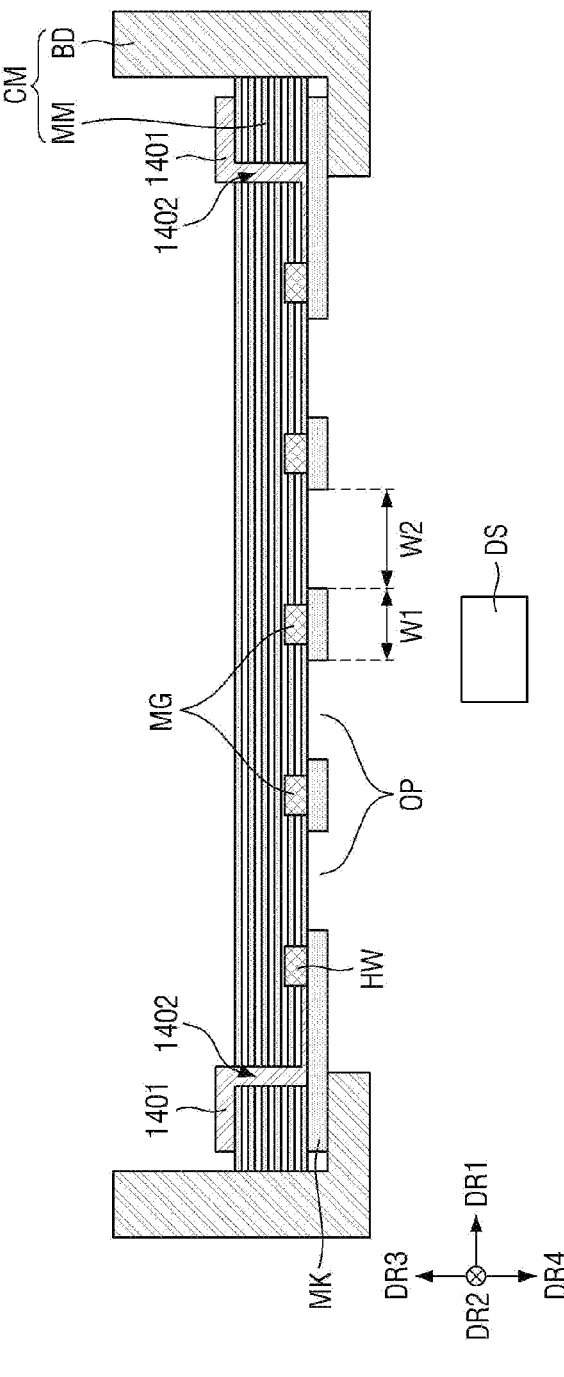
FIG. 14 is a cross-sectional view showing a part of a deposition apparatus including a mask according to an alternative embodiment.

FIG. 14 is a cross-sectional view showing a part of a deposition apparatus including a mask according to an alternative embodiment.

The embodiment of FIG. 14 is substantially to the same as the embodiments of FIGS. 11 and 12; and, therefore, any repetitive detailed descriptions of the same or like elements as those described above will be omitted. Hereinafter, only the configuration of the embodiment of FIG. 14 that is different from that of the embodiments of FIGS. 11 and 12 will be described. Accordingly, features of the elements shown in FIG. 14 are substantially the same as those of the embodiments of FIGS. 11 and 12.

In an embodiment, as shown in FIG. 14, the heater wires HW may be disposed between the fixing member CM and the mask MK. In the embodiments of FIGS. 11 and 12, as described above, the heater wires HW are disposed on the upper surface of the mask MK facing a first normal direction (e.g., the DR4 direction of FIG. 14) to face the deposition source DS. Alternatively, in the embodiment of FIG. 14, the heater wires HW are disposed in a second normal direction (e.g., DR3 of FIG. 14) opposite to the first normal direction (e.g., DR4 of FIG. 14) in which the heater wires HW face the deposition source DS.

Referring to FIG. 14, the heater wires HW may be disposed between the fixing member CM and the mask MK, and conductive connecting members such as pads PD and wires HL for applying current or voltage to the heater wires HW may be designed to penetrate a portion of the magnetic substrate MM. In an embodiment, the magnetic substrate MM is a conduit in which conductive connection members 1401 are disposed and may include at least one through hole 1402 defined through in a first normal direction (e.g., the DR4 direction of FIG. 14). Here, the through hole 1402 may be formed by a physical drilling process, but the disclosure is not limited thereto.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A mask for a deposition process of an emission layer, the mask comprising:

a mask body comprising a plurality of first mask grids extending along a first direction and a plurality of second mask grids extending along a second direction perpendicular to the first direction;

a plurality of holes defined by the plurality of first mask grids and the plurality of second mask grids, wherein the plurality of holes is defined through a portion of the mask body;

a plurality of first heater wires disposed to overlap the plurality of first mask grids and connected to a plurality of first wires;

a plurality of second heater wires disposed to overlap the plurality of second mask grids and connected to a plurality of second wires;

a plurality of first pads connected to the plurality of first wires; and a plurality of second pads connected to the plurality of second wires, wherein a current or a voltage is inputted to the plurality of first pads and the plurality of second pads through a probe.

2. The mask of claim 1, wherein the plurality of first wires and the plurality of first heater wires are disposed to overlap each other, respectively, and wherein the plurality of second wires and the plurality of second heater wires are disposed to overlap each other, respectively.

3. The mask of claim 1, wherein the probe is set to independently apply the current or the voltage to the plurality of first pads, and wherein the probe is set to independently apply the current or the voltage to the plurality of second pads.

4. The mask of claim 1, wherein the plurality of first heater wires is disconnected from each other, and wherein the plurality of second heater wires is disconnected from each other.

5. The mask of claim 4, wherein the plurality of first heater wires is disconnected from each other at a boundary of the plurality of holes, and wherein the plurality of second heater wires are disconnected from each other at the boundary of the plurality of holes.

6. The mask of claim 1, wherein a part of the plurality of first heater wires thermally expands a part of the plurality of first grids by being heated based on the current or the voltage, and wherein a part of the plurality of second heater wires thermally expands a part of the plurality of second grids by being heated based on the current or the voltage.

7. The mask of claim 6, wherein the mask thermally expands the part of the plurality of first grids, and thermally expands the part of the plurality of second grids during the deposition process of the emission layer.

8. The mask of claim 1, wherein the emission layer is a partial layer of an organic light emitting diodes disposed on a semiconductor wafer substrate.

9. The mask of claim 1, wherein the mask is disposed inside a deposition chamber of a deposition apparatus, and the plurality of first heater wires and the plurality of second heater wires are disposed to face a deposition source disposed inside the deposition chamber.

10. The mask of claim 1, wherein the mask is disposed inside a deposition chamber of a deposition apparatus to be fixed by a magnetic substrate, and wherein the plurality of first heater wires and the plurality of second heater wires are disposed between the magnetic substrate and the mask.

11. A deposition apparatus for a deposition process of an emission layer, the deposition apparatus comprising: a deposition chamber; a mask disposed inside the deposition chamber; a deposition source disposed inside the deposition chamber; and a fixing member disposed inside the deposition chamber, wherein the fixing member comprises a body portion and a magnetic substrate which fixes the mask thereto, wherein the mask comprises: a mask body comprising a plurality of first mask grids extending along a first direction and a plurality of second mask grids extending along a second direction perpendicular to the first direction; a plurality of holes defined by the plurality of first mask grids and the plurality of second mask grids, wherein the plurality of holes is defined through a part of the mask body; a plurality of first heater wires disposed to overlap the plurality of first mask grids and connected to a plurality of first wires; a plurality of second heater wires disposed to overlap the plurality of second mask grids and connected to a plurality of second wires; a plurality of first pads connected to the plurality of first wires; and a plurality of second pads connected to the plurality of second wires, wherein a current or a voltage is inputted to the plurality of first pads and the plurality of second pads through a probe.

12. The deposition apparatus of claim 11, wherein the plurality of first wires and the plurality of first heater wires are disposed to overlap each other, respectively, and wherein the plurality of second wires and the plurality of second heater wires are disposed to overlap each other, respectively.

13. The deposition apparatus of claim 11, wherein the probe is set to independently apply the current or the voltage to the plurality of first pads, and wherein the probe is set to independently apply the current or the voltage to the plurality of second pads.

14. The deposition apparatus of claim 11, wherein the plurality of first heater wires is disconnected from each other, and wherein the plurality of second heater wires is disconnected from each other.

15. The deposition apparatus of claim 14, wherein the plurality of first heater wires is disconnected from each other at a boundary of the plurality of holes, and wherein the plurality of second heater wires is disconnected from each other at the boundary of the plurality of holes.

16. The deposition apparatus of claim 11, wherein a part of the plurality of first heater wires thermally expands a part of the plurality of first grids by being heated based on the current or the voltage, and wherein a part of the plurality of second heater wires thermally expands a part of the plurality of second grids by being heated based on the current or the voltage.

17. The deposition apparatus of claim 16, wherein the mask thermally expands the part of the plurality of first grids, and thermally expands the part of the plurality of second grids during the deposition process of the emission layer.

18. The deposition apparatus of claim 11, wherein the emission layer is a partial layer of an organic light emitting diode disposed on a semiconductor wafer substrate.

19. The deposition apparatus of claim 11, wherein the plurality of first heater wires and the plurality of second heater wires are disposed to face the deposition source.

20. The deposition apparatus of claim 11, wherein the plurality of first heater wires and the plurality of second heater wires are disposed between the magnetic substrate and the mask.

\* \* \* \* \*